United States Patent
Lin et al.

(10) Patent No.: US 9,857,393 B2
(45) Date of Patent: Jan. 2, 2018

(54) TESTING DEVICE AND ASSEMBLING METHOD THEREOF

(71) Applicant: Chin-Yi Lin, Hsinchu County (TW)

(72) Inventors: Chin-Yi Lin, Hsinchu County (TW); Tien-Chia Li, Hsinchu County (TW); Ching-Hung Yang, Hsinchu County (TW)

(73) Assignee: Chin-Yi Lin, Hsinchu County (TW)

( * ) Notice: Subject to any disclaimer, the term of this patent is extended or adjusted under 35 U.S.C. 154(b) by 85 days.

(21) Appl. No.: 14/952,931

(22) Filed: Nov. 26, 2015

(65) Prior Publication Data
US 2016/0223586 A1 Aug. 4, 2016

(30) Foreign Application Priority Data
Feb. 4, 2015 (TW) .............................. 104201817 U

(51) Int. Cl.
*G01R 31/20* (2006.01)
*G01R 3/00* (2006.01)
*G01R 1/073* (2006.01)

(52) U.S. Cl.
CPC ........... *G01R 3/00* (2013.01); *G01R 1/07357* (2013.01); *G01R 1/07371* (2013.01)

(58) Field of Classification Search
CPC .............. G01R 1/0425; G01R 1/07314; G01R 31/2851; G01R 1/0416; G01R 1/06727; G01R 31/2868; G01R 31/2893; G01R 31/2896
See application file for complete search history.

(56) References Cited

U.S. PATENT DOCUMENTS

| | | | | |
|---|---|---|---|---|
| 7,180,318 B1* | 2/2007 | Mahoney | ........... | G01R 1/07314 324/756.03 |
| 2003/0146769 A1* | 8/2003 | McQuade | .......... | G01R 1/07307 324/756.03 |
| 2004/0051546 A1* | 3/2004 | Thiessen | ............ | G01R 1/07307 324/755.11 |
| 2008/0088327 A1* | 4/2008 | Kister | ................ | G01R 1/07314 324/754.03 |

* cited by examiner

Primary Examiner — Tung X Nguyen
(74) *Attorney, Agent, or Firm* — CKC & Partners Co., Ltd.

(57) ABSTRACT

A testing device utilized in a testing apparatus includes a top guiding board having top penetrating openings, a bottom guiding board disposed at one side of the top guiding board and having bottom penetrating openings, and elastic contact structures disposed between the top guiding board and the bottom guiding board. A testing device offset (represented by $d_2$) exists between the top guiding board and the bottom guiding board. Each elastic contact structure has a tip section, a body section, and a tail section in sequence. The elastic contact structures pass through the top penetrating openings and the bottom penetrating openings respectively. Each elastic contact structure has an elastic contact structure offset between the tip section and the tail section. Each elastic contact structure has a target elastic contact structure offset (represented by $d_1$), in which $d_1$ and $d_2$ satisfy the following equation:

$$d_2 = d_1 \pm 50 \sim 200 \; \mu m.$$

18 Claims, 4 Drawing Sheets

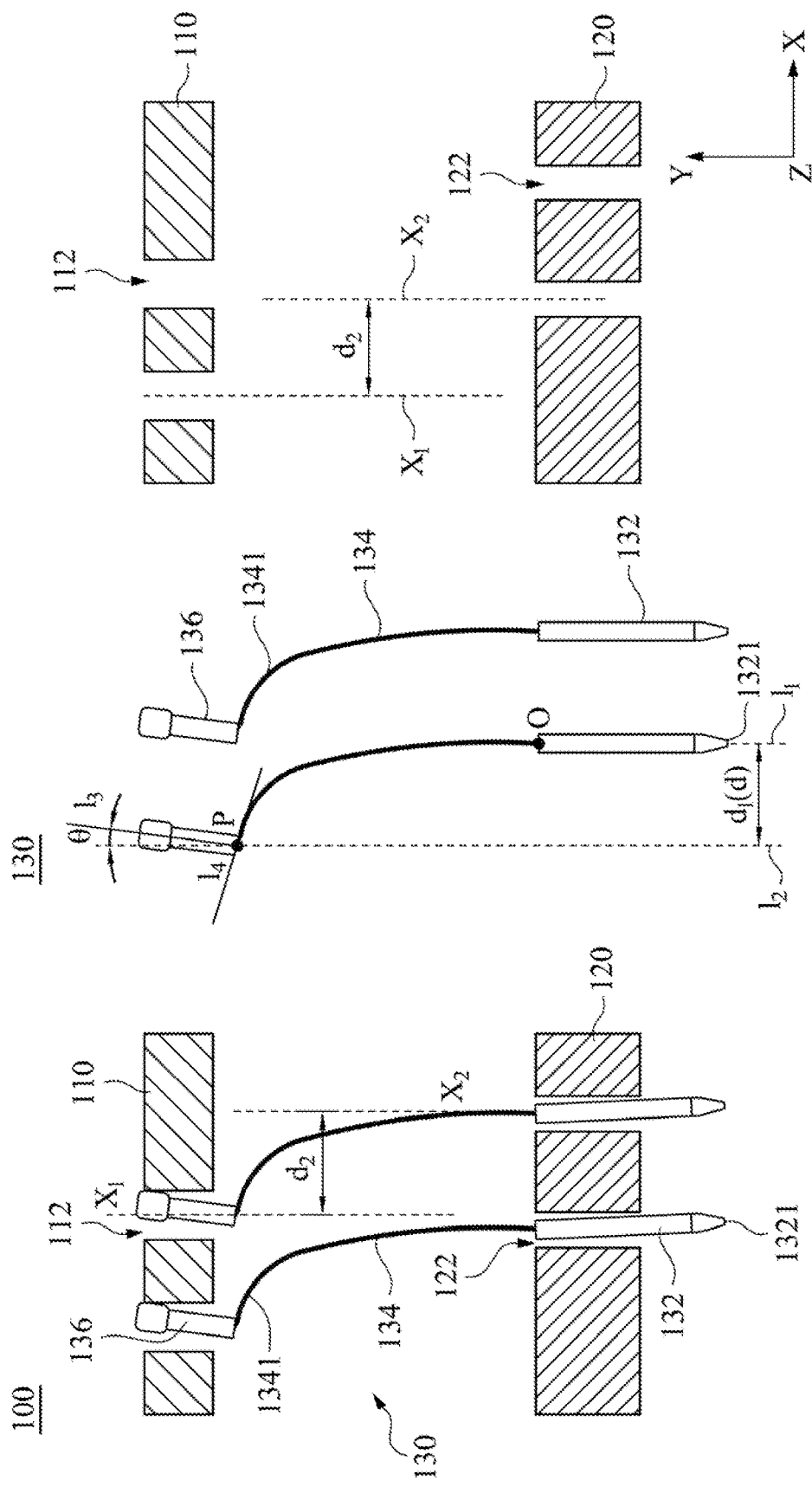

TESTING DEVICE AND ASSEMBLING METHOD THEREOF

RELATED APPLICATIONS

This application claims priority to Taiwanese Application Serial Number 104201817, filed Feb. 4, 2015, which is herein incorporated by reference.

BACKGROUND

Field of Invention

The present invention relates to a testing device. More particularly, the present invention relates to a testing apparatus.

Description of Related Art

A conventional testing apparatus may include a circuit board, a space converter board and a testing device. The testing device has elastic contact structures, top and bottom guiding boards for positioning an elastic contact structure. Both ends of the elastic contact structure penetrate through the top guiding board and the bottom guiding board respectively. The end of the elastic contact structure penetrating through the bottom guiding board contacts a contact on a device under test (DUT), such as a pad or a bump, and the end of the elastic contact structure penetrating through the top guiding board electrically contacts the space converter board and the circuit board. Furthermore, an arrangement of penetrating openings on the bottom guiding board is made in response to the contacts on the DUT.

In general, an assembly of the testing device is performed by first fixing the elastic contact structures on the bottom guiding board, and then assembling the top guiding board. However, the elastic contact structures of the testing device cannot contact the DUT stably because the swaying directions of the elastic contact structures are not consistent after the assembly is completed.

SUMMARY

The disclosure herein provides a testing device, so that elastic contact structures in a testing device may sway substantially toward the same direction.

One of the embodiments in the disclosure provides a testing device utilized in a testing apparatus. The testing device includes a top guiding board having top penetrating openings, a bottom guiding board disposed at one side of the top guiding board and having bottom penetrating openings. There is a testing device offset $d_2$ between the top guiding board and the bottom guiding board. Elastic contact structures are disposed between the top guiding board and the bottom guiding board, and each of the elastic contact structures has a tip section, a body section, and a tail section in sequence. The elastic contact structures pass through the top and bottom penetrating openings respectively, and each of the elastic contact structures has an elastic contact structure offset disposed between the tip and tail sections, and each of the elastic contact structures has a target elastic contact structure offset $d_1$. The target elastic contact structure offset $d_1$ and testing device offset $d_2$ satisfy the following equation: $d_2=d_1\pm50\sim200$ μm.

Another embodiments of the disclosure provides a method for assembling a test device, the method includes receiving a plurality of tip sections of a plurality of elastic contact structures in a plurality of bottom penetrating openings of a bottom guiding board respectively; receiving a plurality of tail sections of the elastic contact structures in a plurality of top penetrating openings of a top guiding board respectively; and dragging the top guiding board or the bottom guiding board, wherein a target elastic contact structure offset $d_1$ and a testing device offset $d_2$ satisfy the following equation: $d_2=d_1\pm50\sim200$ μm.

To achieve a goal for enabling the swaying directions of the elastic contact structures to be towards the same direction after the assembly is completed, the disclosure designs a relationship in which a target elastic contact structure offset $d_1$ and a testing device offset $d_2$ may satisfy the following equation: $d_2=d_1\pm50\sim200$ μm.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a schematic cross-sectional view of a testing device in accordance with some embodiments of the present disclosure.

FIG. 2 is a schematic view of an elastic contact structure in accordance with some embodiments of the present disclosure.

FIG. 3 is a schematic view of top and bottom guiding boards of a testing device in accordance with some embodiments of the present disclosure.

DETAILED DESCRIPTION

Figure 4A:
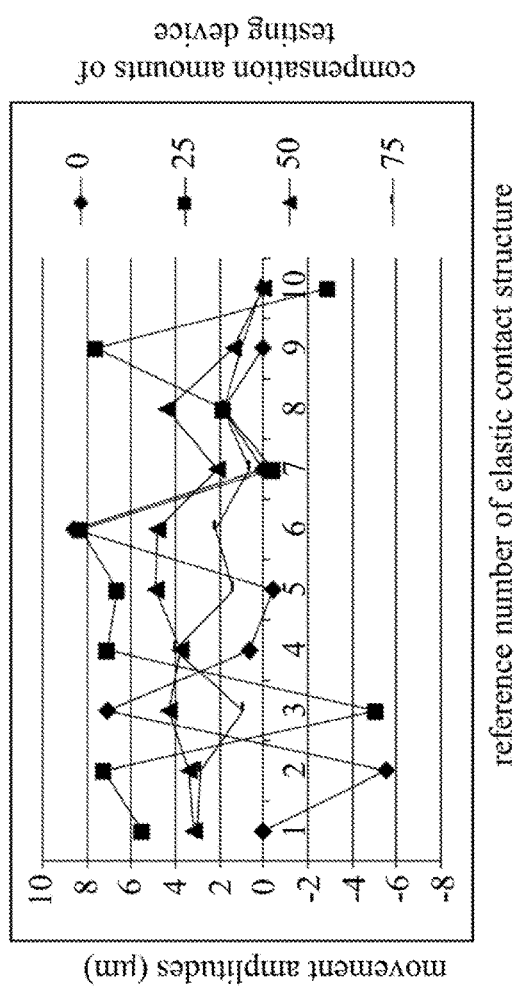
FIG. 4A through FIG. 5B are line graphs of testing results for a testing device by using different testing device offsets in accordance with some embodiments of the present disclosure.

The following disclosures feature of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

As discussed above, the conventional elastic contact structures of the testing device cannot contact the DUT stably because the swaying directions of the elastic contact structures are not consistent after the assembly is completed.

The disclosure herein provides a testing device to solve the aforementioned issue. To achieve a goal of stably contacting the DUT and enabling the swaying directions of the elastic contact structures to be towards the same direction after the assembly is completed, a target elastic contact structure offset $d_1$ and a testing device offset $d_2$ satisfy the following equation: $d_2=d_1\pm50\sim200$ μm.

FIG. 1 is a schematic cross-sectional view of a testing device in accordance with an embodiment of the disclosure. A testing device 100 includes a top guiding board 110, a bottom guiding board 120 disposed at one side of the top guiding board 110, and elastic contact structures 130 disposed between the top guiding board 110 and the bottom guiding board 120. The top guiding board 110 has top penetrating openings 112 to receive and fix the elastic contact structures 130. The bottom guiding board 120 has bottom penetrating openings 122 to receive and fax the elastic contact structures 130.

The elastic contact structure 130 includes a tip section 132, a body section 134, and a tail section 136 in sequence. The tip section 132 passes through the bottom penetrating opening of the bottom guiding board 120, and a contact tip 1321 of the tip section 132 contacts DUT (not shown). The tail section 136 is received in the top penetrating opening 112 of the top guiding board 110, and is in contact with a pad of a space conversion board or a circuit board (not shown) by passing through the top penetrating opening 112 of the top guiding board 110. The body section 134 is disposed between the top guiding board 110 and the bottom guiding board 120. The top guiding board 110 and the bottom guiding board 120 can constrain a movement of the elastic contact structure 130 when the contact tip 1321 contacts the DUT. More specifically, there is a testing device offset $d_2$ between the top guiding board 110 and the bottom guiding board 120. In other words, the top penetrating opening of the top guide board 110 may not be aligned with the bottom penetrating opening 122 of the bottom guiding board 120. Therefore, at least one portion of the elastic contact structures 130 may against the top guiding board 110 (or the bottom guiding board 120) after the elastic contact structures 130 pass through the top penetrating openings 112 and the bottom penetrating openings 122.

In some embodiments, the elastic contact structure 130 may be a metal structure which is elastically deformable, such as a vertical buckling elastic contact structure (also referred to as a Cobra elastic contact structure). Therefore, the body section 134 has a slightly curved body and has an elastic section 1341 adjacent to the tail section 136. The elastic section 1341 is a buckling structure used to generate elasticity on the deformed elastic contact structure 130 by using the buckling principle, when the elastic contact structure 130 suffers an external force.

Reference is made to FIG. 2 and FIG. 3. FIG. 2 is a schematic view of an elastic contact structure of an embodiment of the disclosure. FIG. 3 is a schematic view of the top guiding board 110 and the bottom guiding board 120 of the testing device 100 of an embodiment of the disclosure. Referring to FIG. 1, the tip section is regarded as pointing downward (e.g., pointing toward the contact tip 1321) when the elastic contact structure 130 is in a natural state, which means that there is no external force applied on the elastic contact structure 130. The body section 134 and the tail section 136 extend toward different directions from an intersection point P at which the body section 134 and the tail section 136 are intersected. The body section 134 has an elastic section 1341 adjacent to the tail section 136, and a curvature at the elastic section 1341 is greater than that at a portion of the body section 134 adjacent to the tip section 132. The body section 134 and the tip section 132 extend substantially toward the same direction from an intersection point O at which the body section 134 and the tip section 132 are intersected. For the elastic contact structure 130, a first imaginary line $l_1$ can be dragged from a central axis of the contact tip 1321 of the tip section 132, correspondingly, and a second imaginary line $l_2$ can be dragged from an intersection point P of the body section 134 and the tail section 136, and the second imaginary line $l_2$ is parallel to the first imaginary line $l_1$. An elastic contact structure offset d between the tip section 132 and the tail section 136 is a distance from the first imaginary line $l_1$ to the second imaginary line $l_2$. As discussed, a non-zero angle is formed between the tail section 136 and the second imaginary line $l_2$ because the tail section 136 may not parallel to the tip section 132.

Under an ideal condition, a same batch of the elastic contact structures 130 in the testing device 100 should have the same target elastic contact structure offset $d_1$, such that the same batch of the elastic contact structures 130 should also have the same testing device offset d. However, for each of the elastic contact structures 130, the actual testing device offset d may be different from the ideal (in which no manufacturing tolerance is taken into account) target elastic contact structure offset $d_1$ by about ±25 μm (micrometer), the same batch of the elastic contact structures 130 has a manufacturing tolerance. The actual testing device offset d of a minimum elastic contact structure offset among the same batch of the elastic contact structures 130 in the testing device 100 should be substantially equal to the target elastic contact structure offset $d_1$ minus 25 μm. The actual testing device offset d of a maximum elastic contact structure offset among the same batch of elastic contact structures 130 in one testing device 100 should be substantially equal to the target elastic contact structure offset $d_1$ plus 25 μm. More specifically, for example, the target elastic contact structure offset $d_1$ of the same batch of the elastic contact structures 130 in the testing device 100 is 500 μm, and then the actual testing device offset d of each of the elastic contact structures may have an offset in a range from about 475 μm to about 525 μm.

Still referring to FIG. 2, it is noted that, the term "intersection point P" is referred to as an intersection point of a third imaginary line $l_3$ and a fourth imaginary line $l_4$, where the third imaginary line $l_3$ is a line dragged from a central axis of the tail section 136, and the fourth imaginary line $l_4$ is a line dragged from a central axis of the elastic section 1341 of the body section 134.

Further, reference is made to FIG. 3. To constrain a movement of the elastic contact structure 130, there is a testing device offset $d_2$ between the top guiding board 110 and the bottom guiding board 120, such that the top penetrating opening of the top guide board 110 may not be aligned with the bottom penetrating opening 122 of the bottom guiding board 120. One of the top penetrating openings 112 in the top guiding board, and one of the opposite bottom penetrating openings 122 thereof in the bottom guiding board are used as an example for explanation. The top penetrating opening 112 in the top guiding board has a central axis $X_1$, and the bottom penetrating opening 122 in the bottom guiding board has a central axis $X_2$. Thus, a distance between the adjacent central axis $X_1$ and $X_2$ is the testing device offset $d_2$ which is a distance from the top guiding board 110 to the bottom guiding board 120. The top penetrating opening 112 is not aligned with the bottom penetrating opening 122, such that the bottom guiding board 120 has a movement toward left or right relative to the top guiding board 110, and vice versa.

Please refer to FIG. 1 to FIG. 3. The swaying directions of the elastic contact structures 130 are substantially towards the same direction after the assembly is completed because the target elastic contact structure offset $d_1$ and the testing device offset $d_2$ satisfy a specific equation. The testing device offset $d_2$ is a distance between the top guiding board 110 and the bottom guiding board 120. It is noted that, the tail section 136 and/or the tip section 132 may be deformed while contacting with the top guiding board 110 and the bottom guiding board 120 after the elastic contact structure 130 passes through the top penetrating opening 112 and bottom penetrating opening 122. Thus, the testing device offset d or the target elastic contact structure offset $d_1$ discussed hereinafter are the testing device offset d or the target elastic contact structure offset $d_1$ of the elastic contact structure 130 in the natural state as shown in FIG. 2.

More specifically, a process of assembling the testing device 100 may include receiving the tip sections 132 of the elastic contact structures 130 in the bottom penetrating openings 122 of the bottom guiding board 120 respectively, and then receiving the tail sections 136 of the elastic contact structures 130 in the top penetrating openings 112 of the top guiding board 110 respectively. Meanwhile, a distance between a central axis of one of the top penetrating openings 112 in the top guiding board 110 and a central axis of one of the bottom penetrating openings 122 in the bottom guiding board thereof (that is the testing device offset $d_2$) is about equal to the target elastic contact structure offset $d_1$ of the elastic contact structure 130. However, a problem that the swaying directions of the elastic contact structures 130 are not consistent is likely to occur. Therefore, the present disclosure further adjusts the testing device offset $d_2$ between the top guiding board 110 and the bottom guiding board 120 in the testing device 100 to satisfy the following equation: $d_2=d_1\pm50\sim200$ µm. Accordingly, the swaying directions of the elastic contact structures 130 are substantially towards the same direction after the assembly is completed.

Specifically, after the elastic contact structures 130 are received in the top guiding board 110 and the bottom guiding board 120, the top guiding board can be dragged toward left (relative to the bottom guiding board 120) to increase a distance between the top guiding board 110 and the bottom guiding board 120 in the X direction, and satisfy the equation: $d_2=d_1\pm50\sim200$ µm. On the other hand, the top guiding board can be dragged toward right (relative to the bottom guiding board 120) to decrease a distance between the top guiding board 110 and the bottom guiding board 120 in the X direction and satisfy the equation: $d_2=d_1-50\sim200$ µm. As a result, after the elastic contact structures 130 is received in the top guiding board 110 and the bottom guiding board 120, the swaying directions of the elastic contact structures 130 are substantially towards the same direction after the assembly is completed, the top guiding board 110 can be laterally moved to make the testing device offset $d_2$ between the top guiding board 110 and the bottom guiding board 120 satisfy the equation: $d_2=d_1\pm50\sim200$ µm. Of course, the top penetrating openings 112 may not be aligned with the bottom penetrating openings 122. Therefore, the bottom guiding board 120 is dragged toward right or left relative to the top guiding board 110, such that the testing device offset $d_2$ between the top guiding board 110 and the bottom guiding board 120 satisfies the equation: $d_2=d_1\pm50\sim200$ µm, which does not intend to limit the disclosure.

It is noted that, the phrase "after the assembly of the testing device 100 is completed" includes receiving the same batch of the elastic contact structures 130 in the top guiding board 110 and the bottom guiding board 120, and further dragging the top guiding board 110 or the bottom guiding board 120 toward right or left (relative to one of the top guiding board 110 and the bottom guiding board 120), thereby enabling the testing device offset $d_2$ between the top guiding board 110 and the bottom guiding board 120 to satisfy the equation: $d_2=d_1\pm50\sim200$ µm.

In the disclosure herein, for the same batch of the elastic contact structures 130, the relationship between the target elastic contact structure offset $d_1$ and the testing device offset $d_2$ which is between the top guiding board 110 and the bottom guiding board 120 is designed to satisfy the equation: $d_2=d_1\pm50\sim200$ µm. In other words, the testing device offset $d_2$ between the top guiding board 110 and the bottom guiding board 120 is at least greater than the maximum elastic contact structure offset among one of the elastic contact structures 130, when the testing device offset $d_2$ satisfies the designing equation: $d_2=d_1\pm50\sim200$ µm. That is the testing device offset $d_2$ is a distance from $d_1+50$ µm to $d_1+200$ µm. Meanwhile, besides the swaying directions of the elastic contact structures 130 are substantially towards the same direction after the assembly of the testing device 100 is completed, the present disclosure can lower the contacting force between the elastic contact structure 130 and a DUT, and also can enhance integrity of the DUT when the testing performed.

Alternatively, the testing device offset $d_2$ between the top guiding board 110 and the bottom guiding board 120 is at least smaller than the minimum elastic contact structure offset among one of the elastic contact structures 130, when the testing device offset $d_2$ satisfies the signing equation: $d_2=d_1-50\sim200$ µm, that is, the testing device offset $d_2$ is a distance from $d_1-200$ µm to $d_1-50$ µm. Meanwhile, besides the swaying directions of the elastic contact structures 130 are substantially towards the same direction after the assembly of the testing device 100 is completed, the present disclosure can provide the stable contact between the elastic contact structure 130 and a DUT when the testing is performed.

Reference is made to FIG. 4A through FIG. 5B, which are line graphs of testing results for a testing device by using different testing device offsets in accordance with some embodiments of the present disclosure. The line graphs shown in FIG. 4A through FIG. 5B represent the results of the testing device assembled under different compensation amounts of the testing device. A vertical axis in the figures represents a movement amplitude (unit in µm) of the elastic contact structure 130 after the assembly of the testing device is completed, and a horizontal axis in the figures represents the reference numbers of the ten elastic contact structures 130.

The phrase "a compensation amount of the testing device" means gradually increasing or decreasing a distance between the top guiding board 110 and the bottom guiding board 120 during each of the testing, such that, as discussed above, the testing device offset $d_2$ between the top guiding board 110 and the bottom guiding board 120 is about equal to the target elastic contact structure offset $d_1$ after the elastic contact structure 130 is received in the top guiding board 110 and the bottom guiding board 120. Meanwhile, a compensation amount of the testing device is 0 µm, which represents that the testing device offset $d_2$ is equal to the target elastic contact structure offset $d_1$. If the compensation amount of the testing device is 25 µm, it represents that the testing device offset $d_2$ is about equal to the target elastic contact structure offset $d_1$ plus 25 µm; and if the compensation amount of the testing device is −25 µm, it represents that the testing device offset $d_2$ is about equal to the target elastic contact structure offset $d_1$ subtract to 25 µm.

Figure 4B:
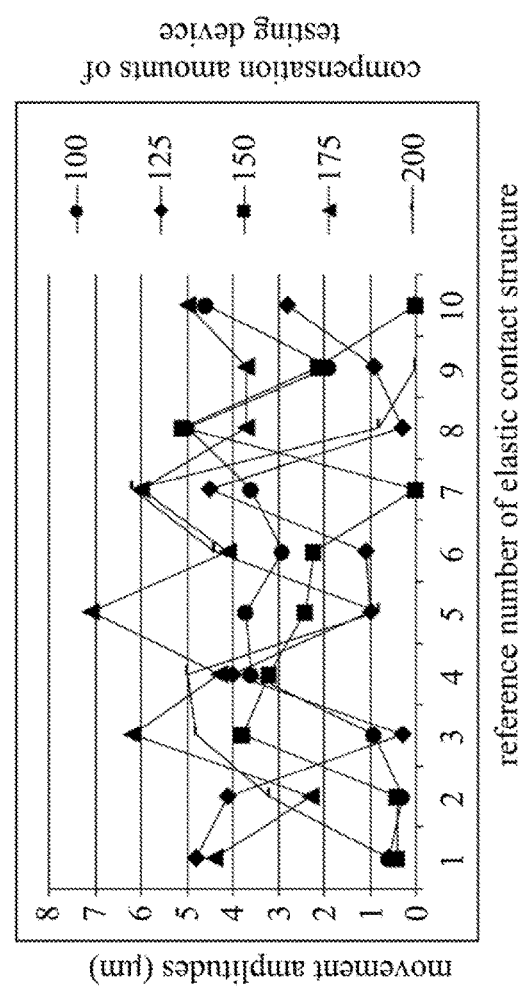

Referring to FIG. 4A and FIG. 4B, when the compensation amount of the testing device 100 is positive, it represents that the testing device offset $d_2$ between the top guiding board 110 and the bottom guiding board 120 is smaller than the distance between the central axis of the top penetrating opening 112 and the bottom penetrating opening 122 in X direction as shown in FIG. 3. The testing device offset $d_2$ is ranged from about the target elastic contact structure offset $d_1$ (in this case the compensation amount of the testing device 100 is 0 μm, that is, the relationship is $d_2=d_1+0$ μm) to a value greater than the target elastic contact structure offset $d_1$ by 200 μm (in this case the compensation amount of the testing device 100 is 200 μm, that is, the relationship is $d_2=d_1+200$ μm). FIG. 4A shows the testing results when the compensation amounts of the testing device 100 are 0 μmm, 25 μm, 50 μm, and 75 μm. FIG. 4B shows the testing results when the compensation amounts of the testing device 100 are 100 μm, 125 μm, 150 μm, 175 μm, and 200 μm. The testing results mainly examine the swaying directions of the ten elastic contact structures of which the reference numbers are 1 to 10 after the assembly of the testing device 100 is completed.

Referring to FIG. 4A and FIG. 4B, when the compensation amounts of the testing device are 0 μm and 25 μm, the movement amplitudes of the elastic contact structures 130 (e.g. the ten elastic contact structures of which the reference numbers are 1 to 10 as described above) are positive, negative, or combinations thereof, meaning that the swaying directions of the elastic contact structures 130 are not the same after the assembly of the testing device is completed. When the compensation amount of the testing device 100 is from 50 μm to 200 μm, the movement amplitudes of the elastic contact structures 130 are all positive, meaning that the swaying directions of the elastic contact structures 130 are substantially towards the same direction after the assembly of the testing device 100 is completed.

Figure 5A:
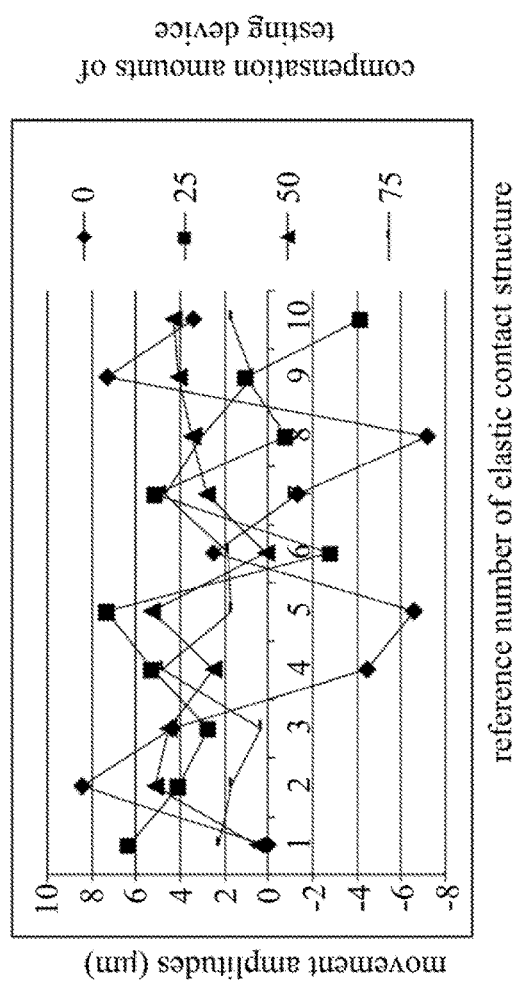
Figure 5B:
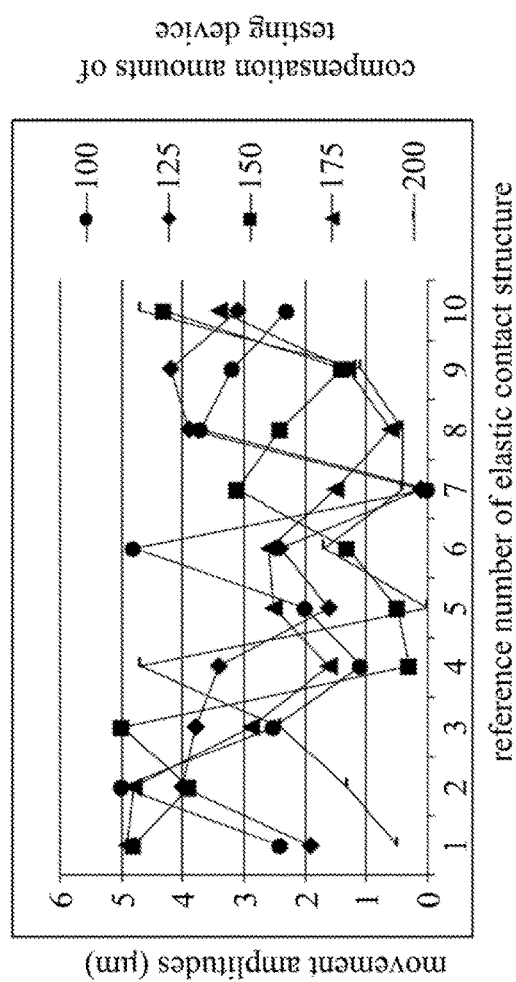

Accordingly, in FIG. 5A and FIG. 5B, the compensation amounts of the testing device 100 are all negative, which represents that the testing device offset $d_2$ between the top guiding board 110 and the bottom guiding board 120 is greater than the distance between the central axis of the top penetrating opening 112 and the bottom penetrating opening 122 in X direction as shown in FIG. 3. The testing device offset $d_2$ is ranged from about the target elastic contact structure offset $d_1$ (in this case the compensation amount of the testing device 100 is 0 μm, that is, the relationship is $d_2=d_1-0$ μm) to a value smaller than the target elastic contact structure offset $d_1$ by 200 μm (in this case the compensation amount of the testing device 100 is 200 μm, that is, the relationship is $d_2=d_1-200$ μm). FIG. 5A shows the testing result when the compensation amounts of the testing device 100 are 0 μm, -25 μm, -50 μm and -75 μm. FIG. 5B shows the testing result when the compensation amounts of the testing device 100 are -100 μm, -125 μm, -150 μm, -175 μm and -200 μm. The testing results mainly examine the swaying directions of the ten elastic contact structures of which the reference numbers are from 1 to 10 after the assembly of the testing device 100 is completed.

In FIG. 5A and FIG. 5B, when the compensation amounts of the testing device 100 is 0 μm and -25 μm, the movement amplitudes of the elastic contact structures 130 (of which the reference numbers are from 1 to 10 as discussed above) are positive, negative, or combinations thereof, meaning that the swaying directions of the elastic contact structures 130 are not the same after the assembly of the testing device 100 is completed. When the compensation amount of the testing device 100 is from -200 μm to -50 μm, the movement amplitudes of the elastic contact structures 130 are all positive, meaning that the swaying directions of the elastic contact structures 130 are substantially towards the same direction after the assembly of the testing device 100 is completed.

Figure 6:
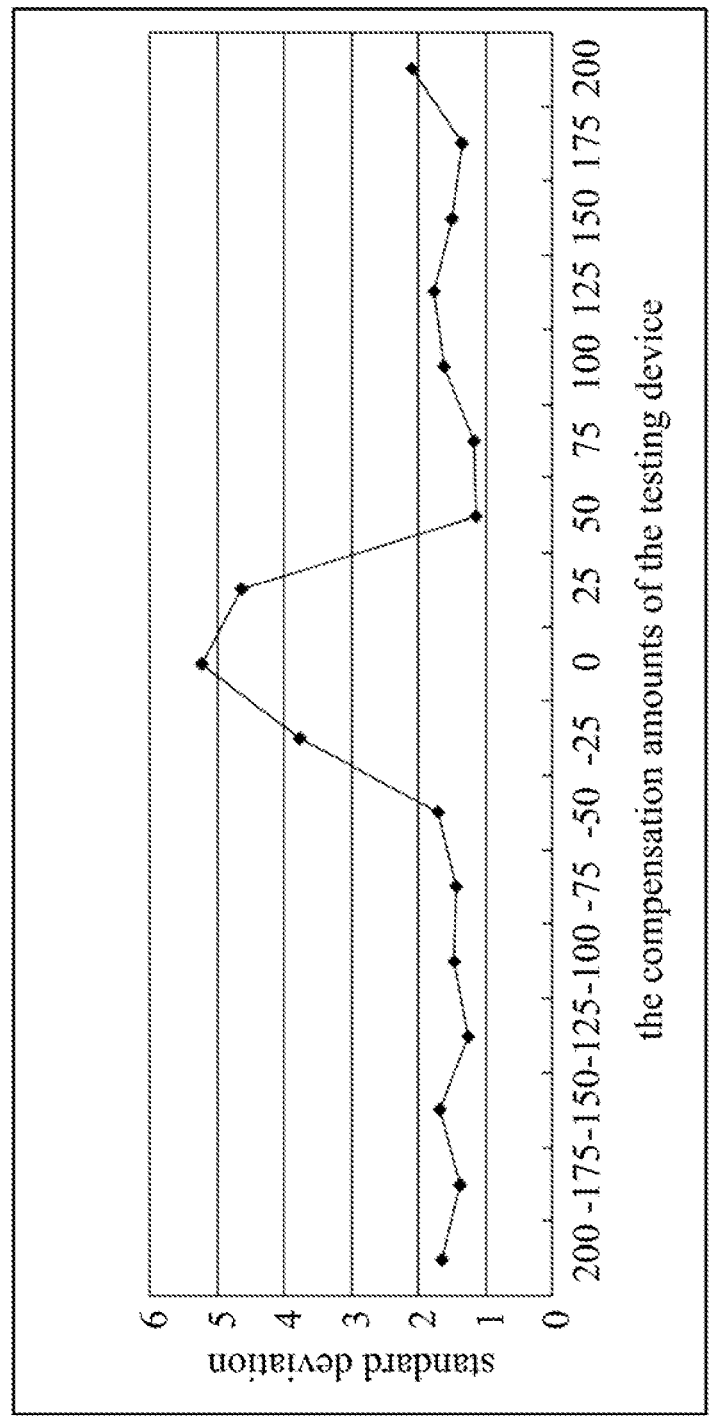
FIG. 6 is a line graph of testing results of FIG. 4A through FIG. 5B shown by standard deviations in accordance with some embodiments of the present disclosure.

Further, reference is made to FIG. 6 which is line graph of testing results of FIG. 4A through FIG. 5B shown by standard deviations in accordance with some embodiments of the present disclosure. Similarly, the movement amplitudes of the testing device 100 have good variations, when the compensation amounts of the testing device 100 are greater than or equal to +50 μm/smaller than or equal to -50 μm but within +200 μm and -200 μm as shown in FIG. 6 and Table 1.

TABLE 1

Standard deviation of the movement amplitudes to the various of compensation amounts of the testing device 100

| compensation amounts of testing device 100 (μm) | standard deviation |
|---|---|
| -200 | 1.634503 |
| -175 | 1.37 |
| -150 | 1.679286 |
| -125 | 1.254751 |
| -100 | 1.469013 |
| -75 | 1.42762 |
| -50 | 1.712338 |
| -25 | 3.751 |
| 0 | 5.237022 |
| 25 | 4.61607 |
| 50 | 1.134749 |
| 75 | 1.165719 |
| 100 | 1.600281 |
| 125 | 1.74631 |
| 150 | 1.5 |
| 175 | 1.347442 |
| 200 | 2.077107 |

In sum, the relationship between the target elastic contact structure offset $d_1$ and the testing device offset $d_2$ which is between the top guiding board and the bottom guiding board is designed to satisfy the equation: $d_2=d_1\pm50\sim200$ μm. In other words, the top guiding board or the bottom guiding board is dragged (relative to one of the top guiding board and the bottom guiding board) to make the testing device offset $d_2$ between the top guiding board and the bottom guiding board satisfy the equation: $d_2=d_1\pm50\sim200$ μm, thus enabling the elastic contact structures of the testing device to move substantially toward the same direction after the assembly is completed by the lateral movement. Thus, the goal that the elastic contact structures can stably contact a DUT is achieved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A testing device utilized in a testing apparatus, the testing device comprising:

a top guiding board having a plurality of top penetrating openings;

a bottom guiding board disposed at one side of the top guiding board and having a plurality of bottom penetrating openings, wherein there is a testing device offset between the top guiding board and the bottom guiding board; and a plurality of elastic contact structures disposed between the top guiding board and the bottom guiding board, each of the elastic contact structures having a tip section, a body section, and a tail section in sequence, wherein elastic contact structures pass through the top penetrating openings and the bottom penetrating openings respectively, and each of the elastic contact structures has an elastic contact structure offset defined between the tip section and the tail section, and each of the elastic contact structures has a target elastic contact structure offset, wherein the target elastic contact structure offset and the testing device offset satisfy the following equation:

$d_2 = d_1 \pm 50 \sim 200$ μm, wherein $d_1$ represents the target elastic contact structure offset, and $d_2$ represents the testing device offset.

2. The testing device of claim 1, wherein a minimum elastic contact structure offset among the elastic contact structures is $d_1 - 25$ μm.

3. The testing device of claim 2, wherein the testing device offset is smaller than the minimum elastic contact structure offset when the target elastic contact structure offset and the testing device offset satisfy the following equation:

$$d_2 = d_1 - 50 \sim 200 \text{ μm}.$$

4. The testing device of claim 1, wherein a maximum elastic contact structure offset among the elastic contact structures is $d_1 + 25$ μm.

5. The testing device of claim 4, wherein the testing device offset is greater than the maximum elastic contact structure offset when the target elastic contact structure offset and the testing device offset satisfy the following equation:

$$d_2 = d_1 + 50 \sim 200 \text{ μm}.$$

6. The testing device of claim 1, wherein the testing device offset between the top guiding board and the bottom guiding board is a distance from each of central axis of the top penetrating openings to each of central axis of the bottom penetrating openings.

7. The testing device of claim 1, wherein the top penetrating openings are not aligned with the bottom penetrating openings.

8. The testing device of claim 1, wherein the elastic contact structure offset is a distance from a first imaginary line to a second imaginary line, where the first imaginary line is a line which is dragged from a contact tip of the tip section and parallel to a central axis of the tip section, and the second imaginary line is a line which is dragged from an intersection point of the body section and the tail section and parallel to the first imaginary line.

9. The testing device of claim 1, wherein the body section of each of the elastic contact structures has an elastic section.

10. The testing device of claim 1, wherein each of the elastic contact structures is a metal structure which is elastically deformable.

11. A method for assembling a test device, the method comprising:

receiving a plurality of tip sections of a plurality of elastic contact structures in a plurality of bottom penetrating openings of a bottom guiding board respectively;

receiving a plurality of tail sections of the elastic contact structures in a plurality of top penetrating openings of a top guiding board respectively; and dragging the top guiding board or the bottom guiding board, wherein a target elastic contact structure offset and a testing device offset satisfy the following equation:

$d_2 = d_1 \pm 50 \sim 200$ μm, wherein $d_1$ represents the target elastic contact structure offset, and $d_2$ represents the testing device offset.

12. The method of claim 11, wherein an elastic contact structure offset is defined between the tip section and the tail section of each of the elastic contact structures, and a minimum elastic contact structure offset among the elastic contact structures is $d_1 - 25$ μm.

13. The method of claim 12, wherein the testing device offset is smaller than the minimum elastic contact structure offset when the target elastic contact structure offset and the testing device offset satisfy the following equation:

$$d_2 = d_1 - 50 \sim 200 \text{ μm}.$$

14. The method of claim 11, wherein an elastic contact structure offset is defined between the tip section and the tail section of each of the elastic contact structures, and a maximum elastic contact structure offset among the elastic contact structures is $d_1 + 25$ μm.

15. The method of claim 14, wherein the testing device offset is greater than the maximum elastic contact structure offset when the target elastic contact structure offset and the testing device offset satisfy the following equation:

$$d_2 = d_1 + 50 \sim 200 \text{ μm}.$$

16. The method of claim 11, wherein the testing device offset between the top guiding board and the bottom guiding board is a distance from each of central axis of the top penetrating openings to each of central axis of the bottom penetrating openings.

17. The method of claim 11, wherein the top penetrating openings are not aligned with the bottom penetrating openings.

18. The method of claim 11, wherein the elastic contact structure offset is a distance from a first imaginary line to a second imaginary line, where the first imaginary line is a line which is dragged from a contact tip of the tip section and parallel to a central axis of the tip section, and the second imaginary line is a line which is dragged from an intersection point of a body section and the tail section and parallel to the first imaginary line.

* * * * *